(12) United States Patent
Zach et al.

(10) Patent No.: US 7,786,450 B2
(45) Date of Patent: Aug. 31, 2010

(54) MULTIPOLE COILS

(75) Inventors: Joachim Zach, Oestringen (DE);
Matthias Kallenbach, Stuetzerbach (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 215 days.

(21) Appl. No.: 12/232,638

(22) Filed: Sep. 22, 2008

(65) Prior Publication Data

US 2009/0084975 A1    Apr. 2, 2009

(30) Foreign Application Priority Data

Sep. 25, 2007    (DE) .................. 10 2007 045 874

(51) Int. Cl.
H01J 1/50        (2006.01)
(52) U.S. Cl. .................. 250/396 ML; 250/396 R; 336/200
(58) Field of Classification Search ............. 250/396 R, 250/396 ML; 336/200
See application file for complete search history.

(56) References Cited

U.S. PATENT DOCUMENTS

| 3,466,580 A |   | 9/1969  | Bull |      |
|-------------|---|---------|------|------|
| 3,466,586 A |   | 9/1969  | Bull |      |
| 3,587,019 A |   | 6/1971  | Bull |      |
| 3,702,450 A | * | 11/1972 | Avery et al. | 335/213 |
| 3,736,543 A |   | 5/1973  | Lademann |  |
| 4,271,370 A |   | 6/1981  | DiMeo |     |
| 4,639,708 A | * | 1/1987  | Weatherly | 336/200 |
| 5,994,703 A | * | 11/1999 | Arai | 250/396 ML |
| 6,982,504 B2 |  | 1/2006  | Brown |     |

FOREIGN PATENT DOCUMENTS

EP            0 153 131        8/1985
WO       WO 2007/065382        6/2007

OTHER PUBLICATIONS

Joachim Zach and Maximilian Haider "Next Generation of Electron Microscopes" NanoS Guide 2008, p. 27, 2007 Wiley-VCH Verlag GmbH & Co. KGaA, Weinheim (Germany).
O. Schwerzer "Spaerische und chromatische Korrektur von Elektronen-Linsen". Optik, DE, Jena, 1947, Pa. 114-132, XP002090897, ISSN: 0863-0259.
D. Joy "The aberration corrected SEM". www.ccl.nist.Gov/812/conference/2005_Talks/Joy.pdf.
D.B. Williams, C. B. Carter "Transmission Electron Microscopy". Springer Publishing Company, p. 93, 1996.

* cited by examiner

*Primary Examiner*—Robert Kim
*Assistant Examiner*—Michael Maskell
(74) *Attorney, Agent, or Firm*—Paul Vincent

(57) ABSTRACT

Multipole coils (1, 2, 3, 4, 5, 6) for influencing particle beams have at least two coils (1, 2) which concentrically enclose an imaginary axis (10), wherein a winding (7) made from a flexible circuit board (8) is formed by means of conducting paths (9) disposed thereon for each coil (1, 2, 3, 4, 5, 6) and the circuit boards (8) are rolled into at least one circuit board layer (11, 12, 13, 14). Multipole coils of this kind (1, 2, 3, 4, 5, 6) are utilized for aberration correction in particle optics, wherein the windings (7) of the multipole coils (1, 2, 3, 4, 5, 6) form windows (16) whose width in the peripheral direction is chosen in such a fashion that no secondary interfering fields occur and whose length in the axial direction corresponds at least to its width.

29 Claims, 5 Drawing Sheets

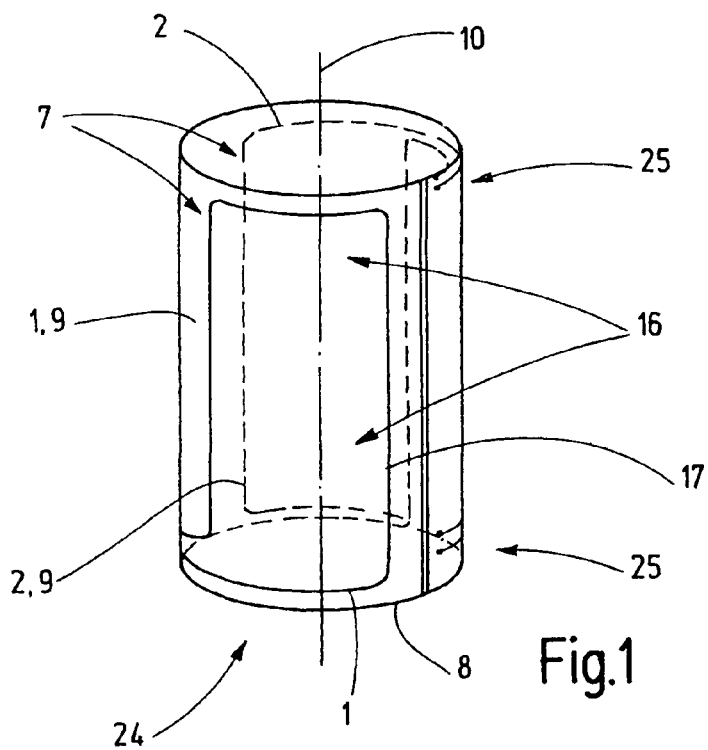
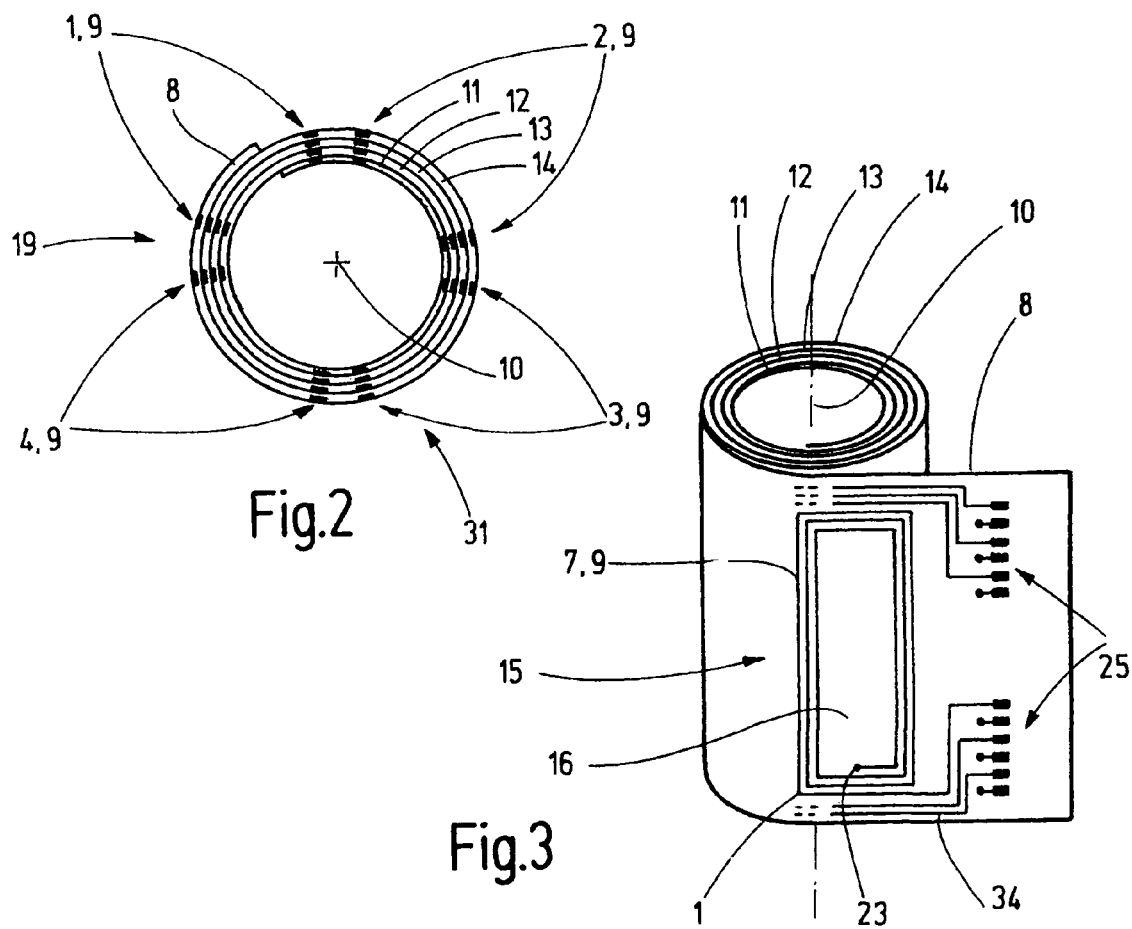

MULTIPOLE COILS

This application claims Paris Convention priority of DE 10 2007 045 874.8 filed Sep. 25, 2007 the complete disclosure of which is hereby incorporated by reference.

BACKGROUND OF THE INVENTION

The invention concerns a multipole coil for influencing a particle beam, having at least two coils which enclose a concentric imaginary axis, wherein each coil has at least one winding made from a flexible circuit board and constructed by means of conducting paths disposed thereon, wherein the circuit board is rolled into at least one circuit board layer.

U.S. Pat. No. 3,702,450 discloses a multipole element of the above-mentioned kind. Towards this end, two coils, each having two halves, are disposed on either side of a beam and rotated through 90 degrees to deflect the beam in the x and y directions. This is especially useful for a scanning beam used to produce an image on a display. An example thereof is a television vacuum tube screen. The coils have substantially spiral shapes and extend from or end at a middle point. The coils are disposed on both sides of a side plate. They are then rolled-up, covered with an insulating layer, and introduced into a steel pipe. The object is to deflect a point-like particle beam. Coils having spiral shaped windings extending up to a middle point can be used for this purpose, since it is only necessary to subject the beam to sufficient electromagnetic forces to cause the deflection. These coils of prior art are however unsuitable for error correction in particle optics for the error-free transfer of images with highest resolution, since they do not produce pure multipole fields and cannot therefore satisfy the conditions for aberration correction. However, the main field of application of the invention is the influence of particle beams, i.e. ion or electron beams in particle optics with the goal of correcting aberrations. Since 1947, when O. Scherzer showed that the optical path of electron lenses can be corrected by non-rotationally symmetrical lenses (O. Scherzer: "Sphärische und chromatische Korrektur von Elektronen-Linsen" (spherical and chromatic correction of electron lenses), OPTIK, DE, JENA, 1947, pages 114-132, XP002090897, ISSN: 0863-0259) this type of correction has been generally used (David C. Joy "The aberration corrected SEM"—http://www.ccl.nist.gov/812/conference/ 2005_Talks/Joy.pdf or David B. Williams and C. Barry Carter "Transmission Electron Microscopy", ISBN 0-306-45324-X, in particular page 93). Dipoles, quadrupoles, hexapoles and octupoles can be generated, in which the electromagnetic coils are disposed in such a fashion as to produce magnetic fields which are concentric to an imaginary axis, wherein the south and north poles are alternately disposed along the periphery. This enables influencing an electron or ion beam that passes through the coil arrangement in the area of the axis (optical axis) in order to correct aberrations.

The image correction suggested by O. Scherzer is based on correcting errors in particle optics caused by a deviation of the optical path from rotational symmetry, e.g. aperture aberrations and chromatic aberrations. The correction is based on the fact that multipoles influence a beam path in such a fashion that optical path distortions occur in two main cross sections under the condition that "beams traveling in two main sections which are perpendicular to each other and which leave the object center at the same angle with respect to the optical axis return to the center of the image at that same angle with respect to the optical axis" (Scherzer op. cit.). This means that distortion can be completely eliminated and an error-free image is therefore possible. (With respect to the influence of corrections, see Scherzer 1947 op. cit.). For the example of a point on the axis in the object plane, the fundamental principle is based on the fact that the beam path in an x-plane and a y-plane is such that two astigmatic intermediate images occur and a corrector is positioned for the beams in the x-plane where the basic path of the beam in the y-plane passes through the optical axis. The corrector for the beams in the y-plane is located where the fundamental path of the beams in the x-plane passes through the optical axis. In this manner, also corrections for off-axial beams can be performed, whereby other regions of the beam paths are also useable in the event that the beam paths are non-round at those locations. However, pure multipole fields must be present in the vicinity of the optical axis where the aberration correction is to take place, since the above mentioned condition is otherwise no longer fulfilled and an image distortion would remain which would render the image useless. The production of pure multipole fields is therefore an absolute requirement for aberration correction and the more precisely it is achieved, the better the image quality and the achievable image resolution.

The multipoles of prior art for aberration correction in particle optics correspond to the representation of FIG. 6.8 (D) of David B. Williams and C. Barry Carter, page 93. These are webs that face towards the optical axis and are wrapped with conducting wires. Multipoles of this type require a large amount of space, comprise fields which are ineffective with respect to the area of the axis due to the large distance from the axis, and cannot be manufactured in an exactly reproducible fashion, since deviations cannot be prevented during winding of the wires both manually as well as mechanically.

In contrast thereto, U.S. Pat. No. 6,982,504B2, U.S. Pat. No. 4,271,370 and U.S. Pat. No. 3,736,543 disclose multipoles for the production of torques in motors, current measuring apparatus, or the like. Towards this end, the multipole elements have spiral windings, which extend up to the middle point of the spiral. One of the two current leads of the spiraling winding is disposed at the middle point or in the middle region. This configuration cannot produce pure multipole fields which, in accordance with the teachings of O. Scherzer (op. cit.), lead to a distortion free image after correction. This is also true for windings, which have windows, but which are covered by other displaced multipole windings, since the production of torques does not require pure multipole fields rather simply optimal torque production. Such electro-mechanic disclosures therefore provide no motivation to one of skill in the art of particle optics applications.

U.S. Pat. No. 3,587,019, U.S. Pat. No. 3,466,586 and U.S. Pat. No. 3,466,580 are concerned, as is U.S. Pat. No. 3,702,450, with the scanning of a beam. However, in contrast to the above-mentioned document, these documents do not have windings in coils rather produce the required fields for the scanning using conducting paths on circuit boards with meandering rectangular waves. These are superimposed on each other in a plurality of circuit board layers in such a fashion that multipole fields can be produced for the deflection of beams. These fields are also, however, much too inhomogeneous to produce distortion-free images in the sense taught by O. Scherzer.

EP 0,153,131 also discloses coil configurations for the production of multipole fields. The coil configurations, however, comprise pole-coils, which are wound about a cylinder in a slanted parallelogram manner. Due to the slanted orientation of the cylinder axis, these multipole fields are also not suitable for generating the distortion-free correction suggested by Scherzer in response to a deviation of the beam from rotational symmetry.

It is therefore the underlying purpose of the invention to introduce multipole coils of the above-mentioned kind, which are suitable for aberration correction in particle optics. The coils should require very reduced constructional space and produce effective fields in the region of the imaginary axis. Moreover, the multipole coils should be produced with high precision and reproducibility.

SUMMARY OF THE INVENTION

The purpose of the invention is achieved in that the windings of the multipole coils define windows whose width in the peripheral direction is chosen in such a fashion that no interfering secondary fields occur and their length in the axial direction corresponds at least to the width.

In contrast to the above mentioned patent documents, the multipole coils in accordance with the invention concern lenses for particle optics. In addition to the generation of torque, force fields, which are suitable for deflecting a beam such as for use in a scanning device, are not lenses.

For scanning, one is only concerned with the displacement of the beam in order to produce an image point on a given surface. The image is thereby produced through spatial and intensity modulations within a certain time interval. With the lens function of the multipole coil in accordance with the invention, one is concerned with elimination of errors per se in this image point such that the image point is imaged on the surface as a clean point. Towards this end, it is necessary to eliminate e.g. spherical aberrations, chromatic aberrations or astigmatism such that the image point is a point with clear borders and not a distorted point with blurred edges. This is of course also true for the transfer of an entire or partial image with a beam without scanning. Such error correction can be carried out in a TEM (transmission electron microscope), an SEM (scanning electron microscope) or a STEM (scanning transmission electron microscope). A further application for the elimination of aberrations can be an adjustment for compensation of constructional errors, by way of example, for the correction of the optical axis. The elimination of aberrations is conventionally done using a corrector. This is based on the teachings of O. Scherzer (1947 op. cit.) and is described by J. Zach and M. Haider (op. cit.). The invention, however, is concerned with the configuration of a partial element of such a corrector, namely the multipole coil at least two of which, however usually a plurality of which, are to be disposed in the corrector.

Due to this influence of a particle beam as a scanned or unscanned beam for error correction, these types of multipole coils are also designated as lenses (see Williams and Carter op. cit. page 97), since they act on the particle beam similar to the manner in which optical lenses act on a beam of light. As in clearly defined imaging with optical lenses, the lenses in particle optics, including non-round lenses such as multipole coils, must produce a pure field. This is necessary for multipole coils with respect to the field line dependence in the peripheral as well as in the axial direction such that, following at least two astigmatic images by at least two multipole coils, such a corrector produces images without distortions. Up to this point in time, these types of multipole coils were only available in the above-mentioned wound coil configurations with which for a quadrupole coil, for example, four iron cores were wound with wires. As can be seen in the above-mentioned illustration of a twelve pole (J. Zach, M. Haider op. cit. 27), this leads to a very large constructional volume. The geometry of such multipoles does not lead to the desired production of a pure multipole field, rather causes secondary interfering multipole fields. For example, a primary dipole field may have a secondary hexapole field, which is superimposed thereon.

For multipole coils of the above mentioned kind (such as U.S. Pat. No. 3,702,450) to be at all suitable for this type of lens function, the coils must be as pure multipole fields as possible in the required region (i.e. in the vicinity of the optical axis) which are as free from interfering fields as possible. Towards this end, the basic idea of the invention is to form windings having multipole coil windows. Windows in this sense not only refer to the fact that there are no windings at that location, rather, moreover, that there are no connecting leads for the windings at those locations, since such leads produce substantially interfering fields which prevent generation of the required multipole fields.

The size of these windows is important to the quality of the fields produced and to the success of the correction. With regard to the width of the window in the peripheral direction, there is an optimum size, which depends, however, on the multipole order. This size can, however, be defined in such a fashion that no secondary interfering fields occur. This can be effected for the corresponding pole order through experimentation or through calculation. For dipoles, this optimum corresponds to a window width of approximately 120°. When four or more poles are disposed in a peripheral direction, the geometrical maximum width is given when the coils are directly adjacent to each other. This means that, relative to the passage opening of the beam, the individual coils seat directly next to each other in the peripheral direction such that the space between the windings of the associated coils is as narrow as possible without producing interfering fields. Towards this end, the conductor-free regions are substantially available for the window. In this case an optimal occurs with the maximum geometric width.

With regard to the size of the window in the axial direction, this should at least correspond to the width, since it would otherwise not be possible to produce effective fields. In this sense, "effective" refers to the action on the fundamental beam path of the particle beam and depends on the nature of the correction. Since a large number of errors can occur, wherein each error can occur in different orders, an exhaustive enumeration is not possible. The possible corrections are the subject of a large number of patent documents and scientific publications.

It is, however, generally useful for the windings to have a substantially rectangular window, wherein the long sides of the window in the axial direction have a length such that a homogenous multipole strength occurs in that direction to produce a fundamental path dependence for the particle beam as required for the desired aberration correction. There is therefore, no limitation for the longitudinal size of the window (i.e. the height of the window in an axial direction). The axial dimensions depend upon achievement of the desired fundamental path dependence, which can be determined for the corresponding correction either by means of calculation or by experimentation.

Also with regard to the width of the window, the geometric limits which are determined by the number of poles which should be accommodated in the peripheral direction, can be increased in that the multipoles are disposed in different layers to achieve larger windows as the coils overlap. In this case, the geometric limitation on the window width given by the periphery is avoided and can be optimized through experimentation or calculation with regard to the elimination of secondary interfering field effects.

Towards this end, e.g. the poles of the multipole coil can be distributed over two peripheral surfaces so that each has half of the multipole coil on the inner, and half of the multipole coil on the outer peripheral surface. The latter are then displaced with respect to the first mentioned multipole coils such that the middle is precisely between the two first mentioned pole coils (see the illustration of FIG. 6). The subdivision is therefore shifted in such a fashion that regular subdivision occurs with respect to the two layers of pole coils.

These multipole coils in accordance with the invention have several distinct advantages compared to wound multipole coils.

The most substantial advantage is that the conducting paths, serving as windings disposed on the circuit boards to produce the coils, have a very small height. It is therefore no longer necessary to guide the magnetic fields over a longer radial distance to the beam such as is the case with wound coils using iron cores and as, in particular, shown in the image of NanoS (op. cit. page 23). These extremely flat coils only have a thickness of one or two circuit board layers (see FIG. 2) and can also produce the required magnetic fields without the use of iron cores acting on the beam, wherein even introduction of iron cores only slightly changes the flat construction. In this manner, the field is produced in the direct vicinity of the region of use so that this field is substantially more pure and does not contain interfering secondary multipole fields. Due to this proximity to the location of use, the fields are stronger and are pure multipole fields with homogenous multipole field strength of sufficient extent in the axial direction. The multipole fields can, in comparison to the conventional multipole lenses be produced with less electrical power. Moreover, for this reason, it is possible to produce the necessary fields with a substantially lower number of windings. This, however, also allows the constructional height to be reduced to an even further degree, as a result of which, the fields can be displaced even more closely to their location of use to further amplify the above-mentioned advantages. For this reason, the multipole coils in accordance with the invention have a fraction of the height but are greatly improved.

Moreover, the shape of the conducting paths can be predetermined with smallest tolerances, which leads, for its part, to an increased precision of the fields. In contrast to a beam deflection device for a scanning device, this is of great importance, in particular, for aberration correction, since errors caused by imprecise fields are avoided. With regard to this feature, the beam deflection devices of scanning devices do not have very high requirements, since the pure displacement of an imaging point on a surface has substantially lower requirements on the precision of the fields. The above-mentioned windows are not even necessary for this purpose.

The achieved precise tolerance regions have not been possible up to this time using normally wound coils. Despite the precision of the multipole coils in accordance with the invention and their substantially decreased height, their production is easier and more economical.

A further substantial advantage of the reduced height is that the corrections facilitate the smallest of constructional sizes which can be used at positions in an apparatus, in particular in an electron microscope, at which the conventional correctors cannot be accommodated due to their size, such as within lenses (see FIG. 10 and associated description thereof).

A configuration of multipole coils in a plurality of planes is not possible with wound coils having iron cores due to the already excessive radial height. This is true for single multipoles generated by coils which overlap in different layers as well as for several multipoles generated at the same axial position, e.g. a hexapole and an octupole which are be disposed at the same position relative to the axis in differing overlapping layers. This later point is, in particular, advantageous in the event that complex correction procedures are to be undertaken. The invention therefore allows for the production of multipole fields in complex, in particular, overlapping configurations. Towards this end, separate control of the individual multipole coils is possible.

With regard to the multipole coils, one should also mention that the produced multipole fields must not correspond precisely to the number of multipole coils. If, for example with a twelve pole element, one regulates the applied current in such a fashion that there are always two alternating north and south poles, a hexapole field can thereby be produced. In this manner, one can also generate a dipole or quadrupole field. Even an octupole field can be produced if one takes into account certain subdivision errors. Due to the overlapping disposition of the multipole coils in accordance with the invention, fields can be generated which could not be produced by a single multipole element through current loading alone and without separation errors. In addition to the above-mentioned multipoles, multipoles with an uneven number of poles, for example, three, five or seven, can also be produced.

The invention enables the production of multipoles for the correction of errors in particle optics that require a minimum amount of space. The accommodation of conventional, wound coils would require considerably larger recesses, e.g. in a magnetic lens. This would change the geometry of such a lens and have a negative effect on the generated magnetic field. The small installation space of the inventive multipole coils completely or largely eliminates such geometrical changes. A correction element can thereby be inserted with minimum disturbance of the lens field.

Multipoles of conventional construction for error correction, which are disposed about a beam tube area of 6 to 10 mm in particle optics, have an outer diameter, which is approximately 2 cm larger than the beam tube area. The inventive multipole coils require diameter enlargement of less than 1 cm. In most cases, a wall thickness of the rolled printed circuit boards of less than 3 mm is sufficient, even when they comprise several layers.

The printed circuit board is thereby generally rolled into a body having a cylindrical surface. The shape could also be different. The roll could also have a polygonal cross-section instead of a circular ring-shaped cross-section, wherein the corners would naturally have to be rounded in correspondence with the deformability of the printed circuit board.

Manufacture can be realized using standard printed circuit board technology, wherein the lithographic or a similar conventional production method always ensures reproducible, exact positioning of the windings of the multipole coils. This enables economic mass production with very high precision, and the expense for manual or mechanical winding around webs is avoided. The latter is, in fact, often difficult, since the wires must be wound around the webs. When two coil bodies are disposed on top of each other in the axial direction, the web of one coil body obstructs winding of the other, and even manual production of a winding is very difficult.

Due to the higher production accuracy, the produced examples are almost identical, and the high calibration effort that was previously required for compensating the production differences through corresponding variations in the current load, is eliminated. Manufacture is thereby considerably facilitated and the production costs substantially reduced, in particular, for large quantities. The capacitive properties of the excitation coils can be precisely influenced, e.g. minimized, through corresponding selection of the conductor separations or dielectric properties of the printed circuit board.

The conventional multipoles for aberration correction in particle optics also had unavoidable angular errors with respect to pole division, since the webs and windings could not be produced with sufficient precision. The invention eliminates this problem, since rolling of the printed circuit boards enables much more precise positioning.

Another advantage is the improved heat dissipation, since gaps containing air form between the wires during production of conventional windings. Heat dissipation is improved in the inventive multipole coils by exactly disposing the printed circuit boards on top of each other.

In addition to increasing the current, the fields generated by the coils can also be reinforced by generating several windings per coil through spiral arrangement or through several printed circuit board layers generated during rolling. A combination of both is naturally also possible, which provides excellent field generation efficiency. When several layers are provided, measures must be taken to position the windings or the spiral arrangements of windings that act as a one coil with great precision with respect to each other.

The windings of the coils of the different printed circuit board layers suitably extend in such a fashion that the winding centers are always disposed on radii in a plane that extends perpendicularly to the axis. This widens the window formed by the coil windings, from the inside to the outside in correspondence with the increasing radius. A hexapole comprises six coils, which provides e.g. an opening angle of approximately 60° each with respect to the axis. This coil design cannot be realized with conventional technology. It is advantageous in that fields of considerably higher correctness of the different multipoles can be generated, since the separation between individual coils can be minimized. This is important, in particular, for a large number of poles. Moreover, reproduction of the generated fields is considerably facilitated through the exact positioning of the windings.

When the windings are spirally arranged in several printed circuit board layers, the outer spiral arrangements suitably comprise more windings than the inner ones. This can be realized on the one hand by providing more space in this area, which is advantageous in that with increasing distance from the axis, the field excitation increases, such that a homogeneous multipole field of maximum strength is provided in the area of the axis. The above-mentioned winding centers are thereby located in the center of the neighboring strip conductors of the spiral arrangement to also enable the above-mentioned outward window enlargement with respect thereto. The field excitation, which is stronger to the outside, could naturally also be realized using larger conductor cross-sections and larger current loads, which would, however, generally require separate current supply lines.

Field excitation can be further improved by doubling the number of windings per printed circuit board layer by providing the front and rear sides of the printed circuit board with strip conductors that form windings. Of course, an insulating layer must then separate the strip conductors of the printed circuit board layers.

The terminals and connections of the different windings that belong to one coil could be realized via strip conductors on the printed circuit boards, which would be disadvantageous with respect to space requirements and generation of interfering fields. For this reason, it is proposed to connect different planes of strip conductors using through connections that pass through the printed circuit board. In this fashion, all windings that belong to one coil can be connected to each other in a simple fashion, and only the different coils of a multipole must then be connected to each other via paths on the printed circuit boards or paths in connection with through connections.

The strip conductors should have a high current carrying capacity to generate fields of corresponding strength. For this reason, it is proposed to increase the cross-sectional surface of the strip conductors through galvanic reinforcement. The strip conductors must thereby consist of material having good conducting properties, normally copper.

The generated fields are more precise, the exacter the positioning of the windings of the respective coils. In order to obtain such positioning for generating several printed circuit board layers during rolling, the invention proposes to provide adjustment markings for these positions on the printed circuit boards. The adjustment markings may be bores through which a mandrel is inserted. The printed circuit boards are subsequently suitably glued to each other on a large area in order to secure the exact position and at the same time provide good heat dissipation.

In order to further improve this heat dissipation, thermally conducting materials may be used which carry the thermal flow to the outside. The glue that is used for gluing the printed circuit boards may be used for this purpose if it has good heat conducting properties. Additional materials may naturally also be provided for this purpose.

Additional electric or electronic components with e.g. measuring and regulation functions may also be provided on the printed circuit board.

The coils of a core-less basic construction may naturally also be provided with a hard or soft magnetic core, or soft or hard-magnetic materials may be used at any location to influence the magnetic flux. Cavities in the printed circuit board, which can be produced e.g. through openings in the window area of the coils, may be utilized for this purpose. Magnetic material may also be disposed on the outer side of the printed circuit board, which connects the coil cores in the form of a yoke.

One further possible application of the multipole coils would be the detection of magnetic multipole fields, i.e. dipole or quadrupole fields etc., which induce currents in the corresponding multipole coils such that the multipole field position and intensity can thereby be detected. Towards this end, the multipole coils in accordance with the invention are identical, however perform a reciprocal function, since they detect these fields and do not produce them.

As mentioned above, particle optics is the field of use of such multipole coils, in particular electron optics. Towards this end, the multipole coils are suitably disposed around a vacuum tube that contains the optical axis. Its purpose is to correct aberrations, as mentioned above, to correct, in particular minor manufacturing aberrations caused by mechanical inaccuracies of the lenses. This is important, in particular, in electron microscopy, which requires high image resolution that cannot be realized without such corrections.

The inventive arrangement is particularly advantageous in that several identical or also different multipoles can be disposed on a printed circuit board. As mentioned above, two dipoles, or even dipoles, quadrupoles, hexapoles, octupoles etc. may be disposed on a printed circuit board, in order to generate combined multipole fields, wherein each multipole is suitably separately driven, thereby permitting correction of aberrations of different orders with exactly the same device. Towards this end, the multipoles must have separate connections for the current load. Multipoles may naturally also be directly connected to each other or by introducing further components in order to superpose different multipole fields that must be positioned in a certain relationship with respect to each other, in order to correspondingly influence the particle beam.

In one particularly suitable example of an arrangement of several multipoles, a dipole and a further dipole, rotated through 90° relative to the first, are disposed on the same printed circuit board. When these two dipoles are disposed on different printed circuit board layers, both can extend over an angle of 120° per coil, as mentioned above, since both abutment as well as overlap is possible. This yields fields of particular precision and efficiency, which cannot be achieved at all with conventional coils. In the above-mentioned combination or in other combinations, several multipole coils may be disposed e.g. to be distributed over several printed circuit board layers, or several multipoles may be disposed on top of each other in the axial direction. Combinations of both arrangements are also possible. In any case, the exact mutual allocation of these multipoles is advantageous, and no significant angular error occurs during allocation. Another simple variant is to roll the printed circuit board only in several layers in order to obtain an arrangement of this type.

Such combinations of several different multipole coils are preferably used in particle optics for correcting various aberrations of different orders. This permits correction of almost any aberration using one single correction element.

In order to prevent a further increase in construction height of a respective particle optical device through introduction of the multipole coils, the printed circuit board may be arranged in the beam passage opening of a lens. A multipole coil of this type can naturally also correct aberrations of upstream or downstream lenses.

In a magnetic lens, the coils are preferably arranged between the magnetic gap and the lens boundary, wherein corresponding widening of the beam passage opening, e.g. through a recess is possible, if required in view of space requirements, such that the multipole coils can be accommodated between the inner lens wall and the vacuum tube. The printed circuit board with multipole coils can naturally also be inserted into other recesses of a particle optical element, wherein the printed circuit board may also simply be disposed into a depression during rolling, optionally in several layers.

It is precisely for such configurations in lenses of a particle optical system such as an electron microscope, that the advantages of reduced height in the radial direction are important. The reduced height often permits an otherwise impossible configuration and thereby decreases the size of such a device. Moreover, the reduced constructional height means that the geometry of the lens does not have to be changed or must be only slightly changed. In this fashion, one not only avoids new sources of error, but correctional measures can also be performed in places which were not possible up to this point.

The invention is explained below with reference to embodiments shown in the drawing.

BRIEF DESCRIPTION OF THE DRAWING

FIG. 1 shows a simple embodiment of the invention to explain the basic principle;

FIG. 2 shows a sectional view of an embodiment with the printed circuit board being rolled into several printed circuit board layers;

FIG. 3 shows a 3-dimensional view of the printed circuit board being rolled in several layers;

DESCRIPTION OF THE PREFERRED EMBODIMENT

Figure 4:
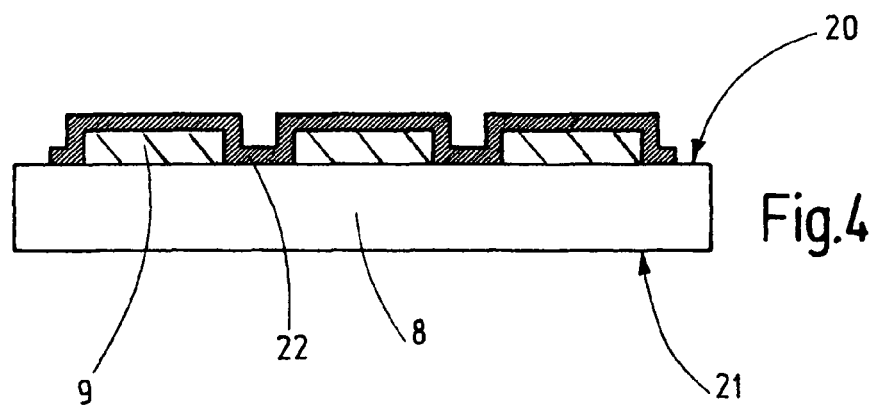
FIG. 4 shows a section through a printed circuit board with strip conductors.

FIG. 1 shows a simple embodiment of the invention in order to explain the basic principle. Two coils 1 and 2, which each consist of one winding 7, are disposed on a printed circuit board 8 for generating a dipole 24. Each winding 7 is disposed on the printed circuit board 8 in the form of a strip conductor 9, and is loaded with current via connections 25. The windings 7 form rectangular windows 16 with rounded edges, wherein the long sides 17 of the windows 16 are oriented along an imaginary axis 10. The axis 10 is the optical axis when the multipole coils are used in the field of particle optics. The printed circuit board 8 is made from a flexible material and rolled into a cylinder which is hollow inside, such that the two coils 1, 2 concentrically enclose the axis 10.

FIG. 2 shows a sectional view of one embodiment, in which the printed circuit board 8 is rolled in several printed circuit board layers 11, 12, 13, 14. These multipole coils 1, 2, 3, 4 form a quadrupole 31, since four coils 1, 2, 3, 4 are concentrically disposed about an imaginary axis 10 (optical axis). The section in a plane 19 perpendicular to the axis 10 thereby shows the cut strip conductors 9, which extend perpendicularly to the axis 10. This illustrates that the strip conductors 9 of the windings 7 of the different printed circuit board layers 11, 12, 13, 14 are precisely stacked in a radial direction. This is particularly important to obtain an exact coil geometry and thereby exact fields when the multipole coils 1, 2, 3, 4 are intended for correcting aberrations in particle optics. Gluing can secure exact positioning.

In this representation, one can clearly see how reduced the construction height of a multipole coil of this type is, in particular, in a region of the four layers of circuit board 11, 12, 13, 14, wherein a large number of multipole coils can be configured within this constructional height e.g. a hexapole, octupole or twelve pole. If one compares this to conventional wound coils (for examples as seen in the figure in NanoS, page 27, op. cit.), then the constructional size difference is quite clear as is the resulting changed geometry. In this manner, much purer multipole fields can be more easily produced.

FIG. 3 shows a perspective view of a printed circuit board 8 rolled into several layers 11, 12, 13, 14. This example shows the design of the strip conductors 9 as windings 7 in a spiral arrangement 15. Only one spiral arrangement 15 is shown as an example. They are, in fact, superposed like the windings 7 of FIG. 2. The strip conductors 9 of the spiral arrangement 15 of the different printed circuit board layers 11, 12, 13, 14 can be connected by through-connections 23, such that all windings 7 of one coil are interconnected. The coils that belong to a multipole element are correspondingly interconnected again to alternately generate one south pole and one north pole of the respective magnetic fields. A rolled printed circuit board 8 of this type may thereby also contain coils 1, 2, 3, 4, 5, 6 etc. of several multipoles. The supply lines 34 guided on the edges may serve for interconnecting the coils of one multipole or also for current loading of one or more multipoles at the connections 25. Also shown are the rectangular windows 16 formed by the windings 7.

FIG. 4 shows a section through a printed circuit board 8 with strip conductors 9. The strip conductors 9 are thereby mounted to the front side 20 of the printed circuit board 8 and covered by an insulating layer 22. Strip conductors 9 may accordingly also be disposed on the rear side 21 of the printed circuit board 8. This is advantageous in that twice as many windings 7 or spiral arrangements 15 of windings 7 can be formed as there are printed circuit board layers 11, 12, 13, 14. In this case, the insulating layer 22 is required for electrically separating the strip conductors 9. During winding of the printed circuit board 8, a glue layer is additionally provided on the full surface, which secures the positions of the coils and thereby also improves dissipation of heat. For this reason, a connection without air gaps is advantageous.

Figure 5:
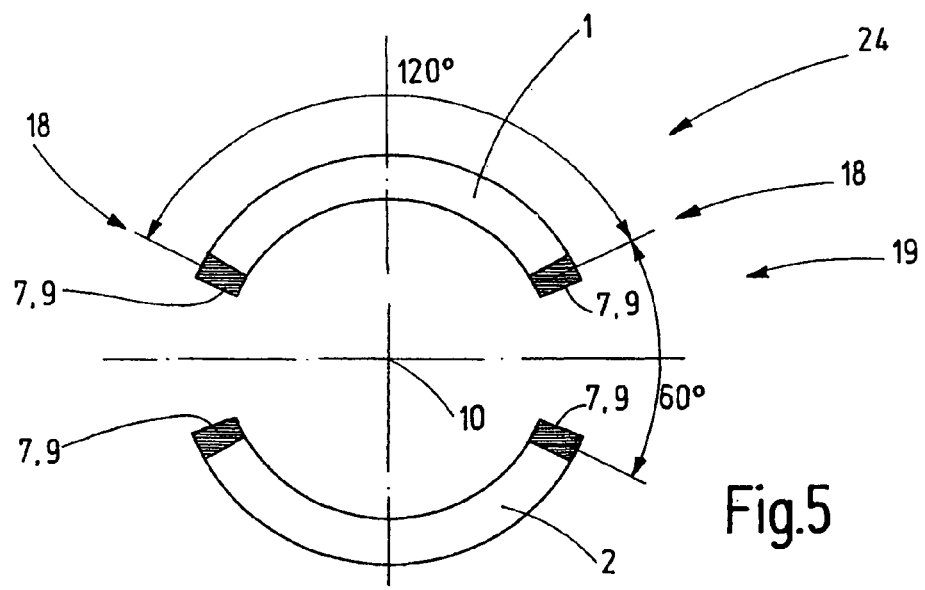
FIG. 5 shows a section through a dipole.

FIG. 5 shows a section through a dipole 24, in which the printed circuit board 8 is not shown. This figure shows that each coil 1 and 2 extends over an area of 120°, which is utilized to generate a very pure dipole field. In this view, the strip conductors 9 are cut in a plane 19 perpendicular to the axis 10, and the winding centers 18 are illustrated which, in simple windings 7 like this, extend in the center of the strip conductors 9. Rolling of the printed circuit board 8 (not shown) provides the strip conductors 9 with the illustrated circular arc shape, which is also advantageous for generating fields, which shall act with optimum precision on the area of the axis 10.

Figure 6:
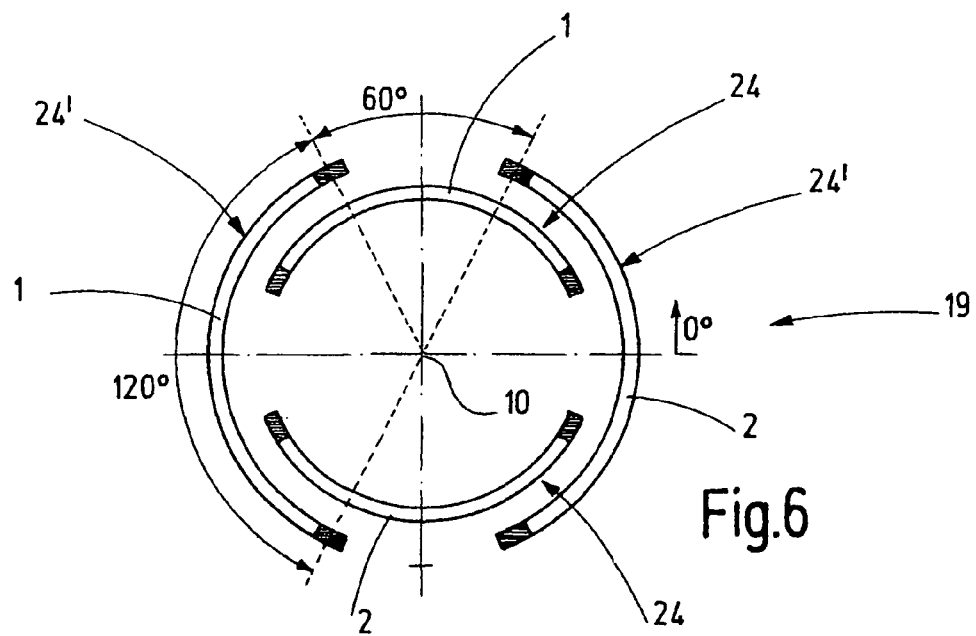
FIG. 6 shows a section through two dipoles, which are disposed in different printed circuit board layers.

FIG. 6 shows a similar section in a plane 19 perpendicular to the axis 10, with two dipoles 24 and 24' disposed on different printed circuit board layers 11, 12. Only the strip conductors 9 of the windings 7 of the coils 1 and 2 of the respective dipoles 24 and 24' are thereby illustrated but not the printed circuit board 8 with its layers 11 and 12. It is rolled in two layers in correspondence with FIGS. 2 and 3. This shows how the dipoles 24 and 24' can be superposed through two printed circuit board layers 11, 12, thereby providing an arrangement which cannot be produced using conventional wound coils. The coils 1 and 2 of the respective dipoles 24 and 24' can naturally also be designed as spiral arrangements 15 in order to reinforce the generated magnetic forces. It is thereby also possible to provide more than two printed circuit board layers 11, 12 to ensure that the number of windings 7 of the two dipoles 24 and 24' can be further increased.

Figure 7:
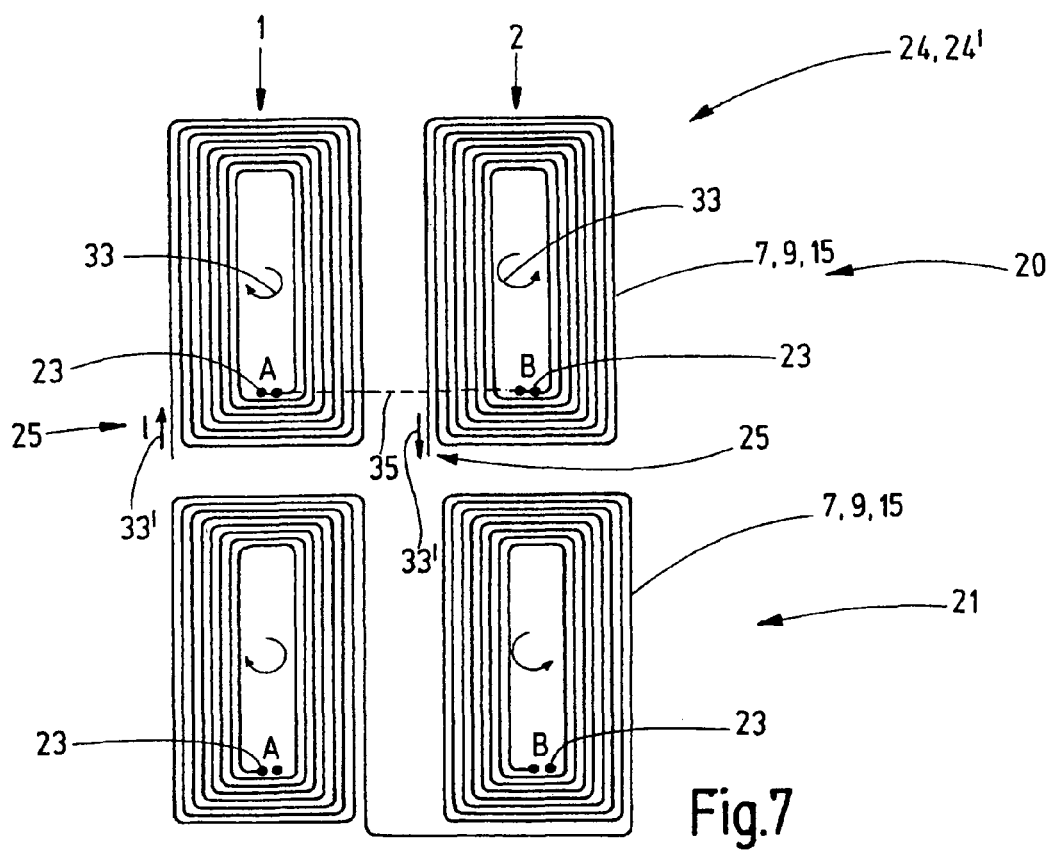
FIG. 7 shows an example of a coil arrangement of a dipole.

FIG. 7 shows one example of a coil arrangement 1, 2, of a dipole 24 or 24', wherein the windings 7 are spirally arranged 15, and wherein the coils 1 and 2 are formed from windings 7, 15 on the front side 20 of a printed circuit board, shown in the upper area of FIG. 7, and additional windings 7, 15 on the rear side 21 of the printed circuit board, shown in the lower area of FIG. 7. The printed circuit board 8 is not shown either. Only the strip conductors 9 mounted to the printed circuit board 8 of the front side 20 are shown in the upper part of the figure and the strip conductors 9 of the rear side 21 of the printed circuit board 8 are shown in the lower part of the figure. The through-connections 23 are connected to each other at A and B to produce an electric connection 35 between A and B in the upper part of the drawing, which is symbolically shown with dashed lines and corresponds to the connection via the windings 7 of the spiral arrangements 15, shown in the lower part of the figure. The printed circuit board 8 is rolled in correspondence with FIG. 1. The dipole 24 or 24' must then only be loaded with current via the connections 25 to produce a current flow, as indicated by arrows 33 and 33'. In this fashion, two coils 1, 2 are available which generate reverse-poled magnetic fields.

Figure 8:
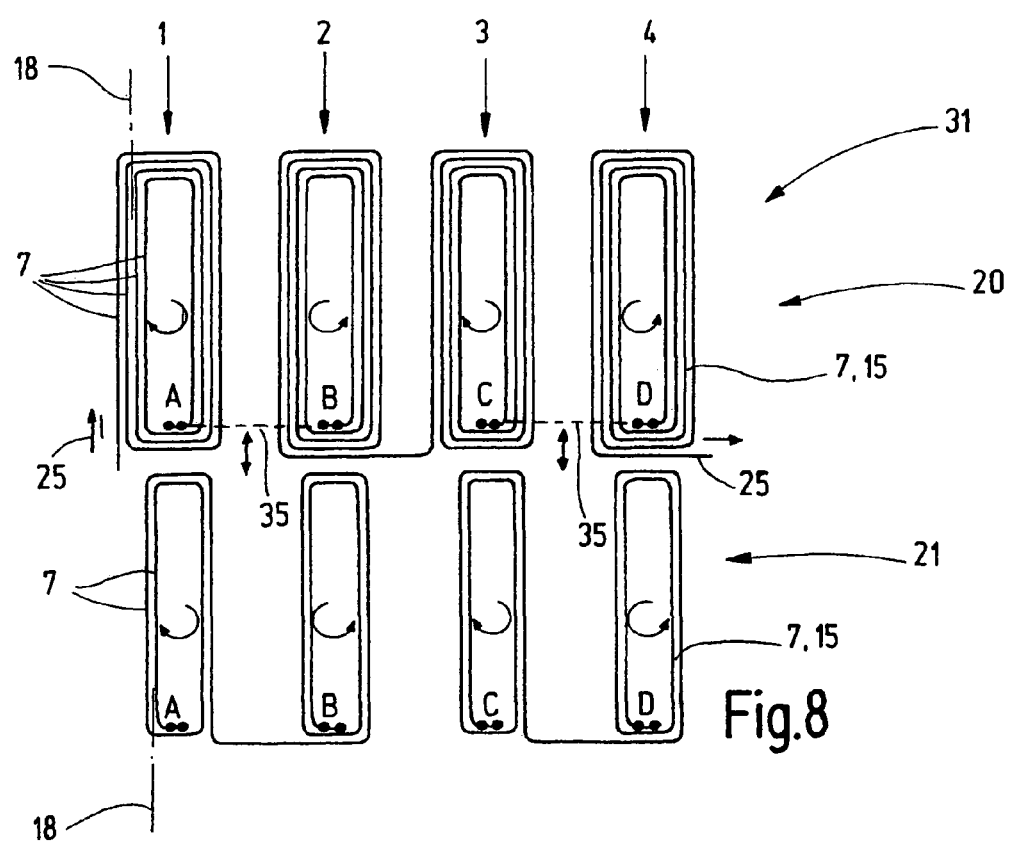
FIG. 8 shows an example of a coil arrangement of a quadrupole.

FIG. 8 shows one example of a coil arrangement with coils 1, 2, 3, and 4, which form a quadrupole 31. The view corresponds to the above-described, wherein the interconnection is correspondingly varied, such that the connections 35 shown in the upper part exist only between the coils 1 and 2 and the coils 3 and 4 via the corresponding windings 7 on the rear side 21 of the printed circuit board, and the windings 7 of the front side 20 of the printed circuit board are connected directly between the coils 2 and 3. In this fashion, the coils 1, 2, 3 and 4 are also interconnected in the quadrupole 31, which results in that the north and south poles of the magnetic fields alternate. The printed circuit board 8 is naturally also rolled in this case, such that the coils 1, 2, 3, 4 concentrically enclose the axis 10.

This view also shows that the spiral arrangement 15 has more windings 7 on the front side 20 of the printed circuit board 8 than the spiral arrangement 15 on the rear side 21 of the printed circuit board 8. In consequence thereof, the outer spiral arrangements 15 have more windings 7 than the inner when the printed circuit board 8 is rolled in such a fashion that its rear side 21 faces to the inside and its front side 20 faces to the outside. The dash-dotted lines show that the winding centers 18 of each spiral arrangement 15 are in the center of the windings 7, which form the respective spiral arrangements 15. These winding centers 18 must be arranged in such a fashion that they all coincide with the radii in a plane 19 perpendicular to the axis 10. This applies not only for the front side 20 and the rear side 21 of a printed circuit board 8 but also for several printed circuit board layers 11, 12, 13, 14 etc.

Figure 9:
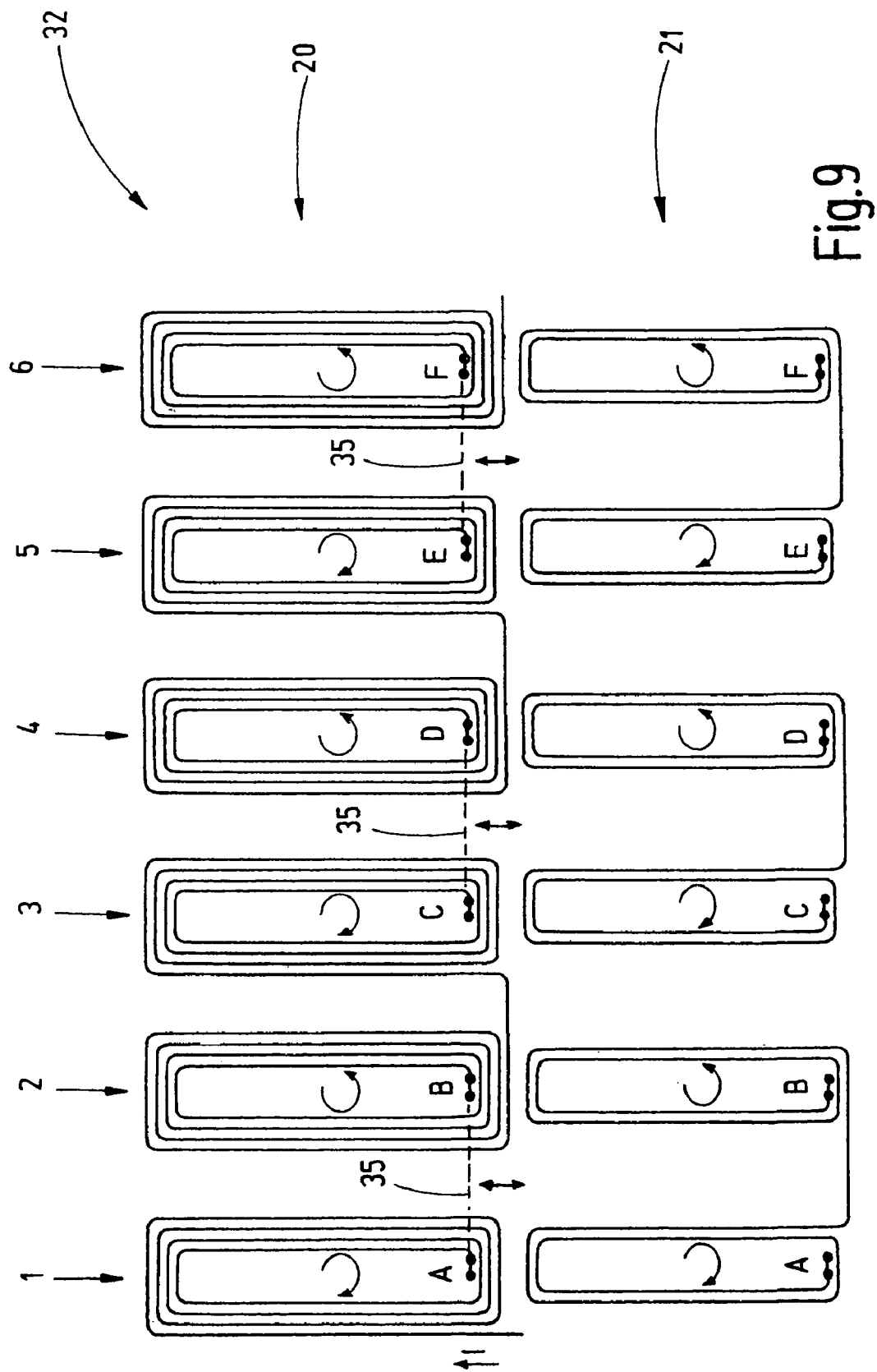
FIG. 9 shows an example of a coil arrangement of a hexapole.

FIG. 9 shows another example of a coil arrangement of a hexapole 32 with six coils 1, 2, 3, 4, 5, 6. The windings 7 are thereby also shown as spiral arrangements 15 on the front side 20 of the printed circuit board 8 (top) and the rear side 21 of the printed circuit board 8 (below), wherein the printed circuit board 8 itself is not shown. The double arrows also indicate that the electric connections 35 between A and B, C and D, E and F of the windings 7 of the front side 20 are realized via the windings 7 on the rear side 21 by providing through-connections at points A, B, C, D, E and F. Otherwise, the above-described applies.

Figure 10:
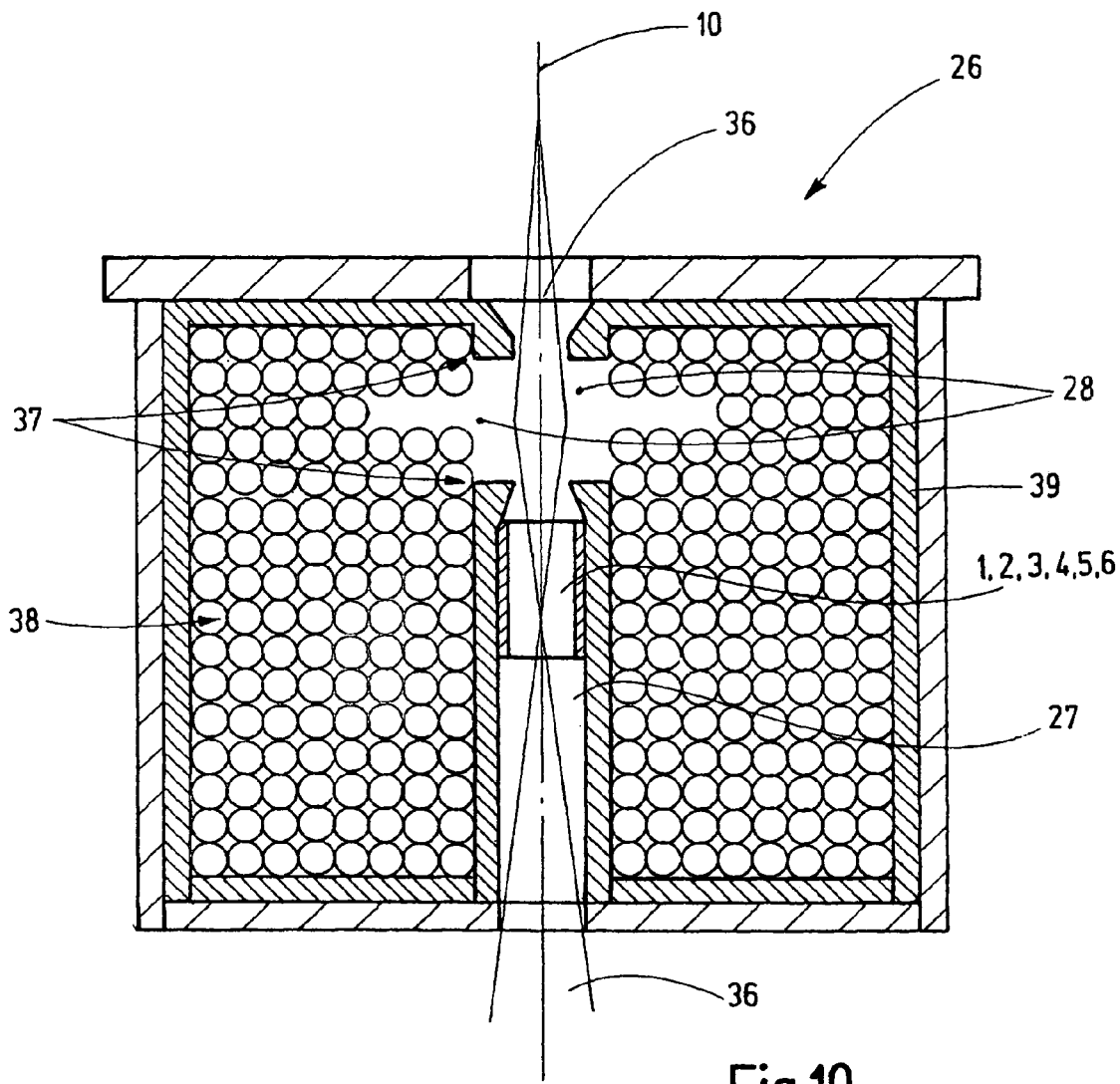
FIG. 10 shows an arrangement of the inventive multipole coils in a lens.

FIG. 10 shows an arrangement of the inventive multipole coils 1, 2, 3, 4, 5, 6 in a lens 26 which is designed as a magnetic lens. The enumeration of six coils is naturally only an example. Any number of multipole elements may be disposed, as mentioned above, even a combination of several multipole elements. They are preferably arranged below the magnetic gap 28 formed by the pole shoes 37, in the beam passage opening 27 of the lens 26. The housing of the lens 26 is shown in sectional view, such that the windings 38, which are also shown in sectional view, can be seen in the sectional view of the iron circuit 39. The behavior of the electron beam 36, which is influenced by the lens 26, is also shown. Since the inventive multipole coils 1, 2, 3, 4, 5, 6 require very little installation space, they may either be disposed directly in the beam passage opening 27 of the lens 26 without impairing the electron beam 36, or if more space is required, a recess may be provided in the beam passage opening 27 for inserting the printed circuit board 8 including multipoles.

Figure 11:
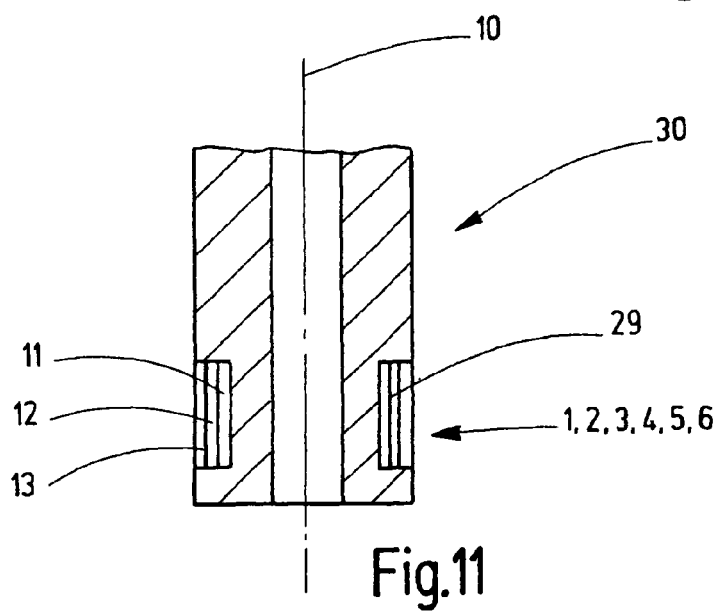
FIG. 11 in a recess of another particle-optical component.

FIG. 11 shows such a recess 29 in an arbitrary particle-optical component, e.g. a steel tube 30. A recess 29 of this type may be disposed on the outer side (as shown) or on the inner side of the beam passage opening 27 in correspondence to the lens 26 of FIG. 10. The printed circuit board layers 11, 12, 13 etc. may thereby be easily inserted into any recess 29. The recess 29 need not be designed in such a fashion that the rolled printed circuit board 8 can be mounted by sliding it on.

The drawings naturally only symbolically show a few embodiments. Many variations are feasible. The windings 7 could also be disposed in circles or ovals. The rectangular shapes could also have a different position, or much more complex arrangements could be provided by disposing many multipole coils 1, 2, 3, 4, 5, 6 in many printed conductor board layers 11, 12, 13, 14 which are used to correct a plurality of aberrations in particle optics. Depending on the purpose of use, the different coils must, of course, be correspondingly interconnected, wherein even separate control of individual coils would be feasible or also an interconnection of several multipole coils, possibly also by introducing further electric or electronic components. The drawing is only designed to give an exemplary idea of the invention.

LIST OF REFERENCE NUMERALS 1,2,3,4,5,6 multipole coils or coils
7 windings
8 printed circuit board
9 strip conductors
10 axis, imaginary (e.g. optical axis)
11,12,13,14 printed circuit board layers
15 spiral arrangement
16 rectangular window
17 long sides of the windows
18 winding centers
19 plane extending perpendicularly to the axis
20 front side of the printed circuit board
21 rear side of the printed circuit board
22 insulating layer
23 through-connections
24 dipole
24' further dipole
25 connections for current load
26 lens
27 beam passage opening of a lens
28 magnetic gap
29 recess
30 particle-optical component, e.g. steel tube
31 quadrupole
32 hexapole
33,33' current direction
34 supply lines
35 connection via windings on the rear side of the printed circuit board
36 electron beam
37 pole shoes
38 windings
39 iron shell
A,B,C,D,E,F through-connections

We claim:

1. A multipole coils configuration for influencing particle beams, the multipole coils configuration comprising:
   a first coil, said first coil having at least one first winding defined by strip conductors disposed on a flexible printed circuit board, said first winding forming a first window having a first width in a peripheral direction and a first length in an axial direction, said first length being greater than or equal to said first width; and
   at least one second coil, said second coil having at least one second winding defined by strip conductors disposed on said flexible printed circuit board, said second winding forming a second window having a second width in a peripheral direction and a second length in an axial direction, said second length being greater than or equal to said second width, wherein said first and said second coils are disposed to concentrically enclose an imaginary axis and said printed circuit board is structured to roll up into at least one printed circuit board layer, wherein each of said first and said second widths is dimensioned to avoid generation of secondary interfering fields.

2. The multipole coils of claim 1, wherein each of said first and said second windings form substantially rectangular windows, wherein long sides of said windows in said axial direction have a length along said axis sufficient to produce a homogenous multipole field strength within an extension required to effect a fundamental path dependence of the particle beam required for a desired correction.

3. The multipole coils of claim 1, wherein the multipole coils have four or more coils in close proximity to each other on said circuit board to produce larger windows.

4. The multipole coil of claim 1, wherein the multipole coils are disposed in differing layers in order to produce large, overlapping coils.

5. The multipole coils of claim 4, wherein winding centers of the windings of each coil of a dipole are disposed on radii which form an angle of approximately 120° with respect to said axis.

6. The multipole coils of claim 1, wherein several windings per coil are obtained through a spiral arrangement.

7. The multipole coils of claim 1, wherein several windings per coil are generated through several printed circuit board layers produced by rolling.

8. The multipole coils of claim 7, wherein windings of coils of different printed circuit board layers extend in such a fashion that winding centers are always disposed along radii in a plane that extends perpendicularly to said axis such that windings of coils form windows which widen from an inside towards an outside in corresponding radial dependence such that a separation between coils can be kept small.

9. The multipole coils of claim 6, wherein the windings are spirally arranged in several printed circuit board layers, outer spiral arrangements having more windings than inner spiral arrangements.

10. The multipole coil of claim 9, wherein winding middles which lie on radii are located in a middle of adjacent conducting paths of the spiraling arrangements to generate an increasing window size in an outward direction.

11. The multipole coils of claim 1, wherein a number of windings per printed circuit board layer is doubled by providing front and rear sides of said printed circuit board with strip conductors which form windings, wherein said strip conductors of said printed circuit board layers are separated by an insulating layer.

12. The multipole coils of claim 6, wherein different planes of strip conductors are interconnected by through-connections.

13. The multipole coils of claim 1, wherein a cross-sectional surface of said strip conductors is increased through galvanic reinforcement.

14. The multipole coils of claim 6, wherein adjustment markings on said printed circuit board are used to obtain printed circuit board layers with exact positioning of windings of respective coils.

15. The multipole coils of claim 14, wherein said adjustment markings are bores through which a mandrel is inserted.

16. The multipole coils of claim 6, wherein printed circuit board layers are glued to each other.

17. The multipole coils of claim 6, wherein thermally conducting materials are introduced for improving outward dissipation of heat.

18. The multipole coils of claim 1, wherein additional electric or electronic components are disposed on said printed circuit board.

19. The multipole coils of claim 1, wherein soft or hard magnetic materials are used to influence a magnetic flux in said printed circuit board.

20. The multipole coils of claim 1, wherein the coils detect magnetic multipole fields.

21. The multipole coils of claim 1, wherein the coils are disposed around a vacuum tube.

22. The multipole coils of claim 1, wherein a plurality of a multipole, a dipole, a quadrupole, a hexapole or an octupole are disposed on said printed circuit board.

23. The multipole coils of claim 22, wherein multipoles have separate connections for current.

24. The multipole coils of claim 1, wherein the coils comprise a dipole and a further dipole which is rotated through 90° with respect thereto.

25. The multipole coils of claim 1, wherein several multipoles are distributed on several printed circuit board layers.

26. The multipole coils of claim 1, wherein several multipoles are disposed on top of each other in said axial direction.

27. The multipole coils of claim 1, wherein said printed circuit board is disposed in a beam passage opening of a lens.

28. The multipole coils of claim 27, wherein the coils are arranged in a magnetic lens between a lens boundary and a magnetic gap.

29. The multipole coils of claim 1, wherein said printed circuit board is inserted into a recess of a particle-optical component.

* * * * *